United States Patent [19]

Harwell et al.

[11] Patent Number: 4,833,889
[45] Date of Patent: May 30, 1989

[54] THERMOELECTRIC REFRIGERATION APPARATUS

[75] Inventors: Robert W. Harwell, Redondo Beach; William M. Simon, Los Angeles, both of Calif.

[73] Assignee: Microluminetics, Los Angeles, Calif.

[21] Appl. No.: 208,284

[22] Filed: Jun. 17, 1988

[51] Int. Cl.$^4$ .............................................. F25B 21/02
[52] U.S. Cl. ....................................................... 62/3.2
[58] Field of Search .............................................. 62/3

[56] References Cited

U.S. PATENT DOCUMENTS

| 2,964,912 | 12/1960 | Roeder, Jr. | |
|---|---|---|---|
| 3,151,465 | 10/1964 | Gelbtuch et al. | 62/3 |
| 3,309,881 | 3/1967 | Beerman | 62/3 |
| 3,561,109 | 2/1971 | Puder | 29/573 |
| 3,963,920 | 6/1976 | Palmer | 250/239 |
| 3,971,229 | 7/1976 | Privas | 62/3 |
| 4,199,953 | 4/1980 | Richter, Jr. et al. | 62/3 |
| 4,270,603 | 6/1981 | Reisman et al. | 62/3 |
| 4,287,720 | 9/1981 | Barthel | 62/45 |
| 4,306,426 | 12/1981 | Berthet et al. | 62/3 |
| 4,606,194 | 8/1986 | Pirtle et al. | 62/6 |

Primary Examiner—Lloyd L. King
Attorney, Agent, or Firm—Pretty, Schroeder, Brueggemann & Clark

[57] ABSTRACT

A solid state thermoelectric refrigeration apparatus suitable for cooling various types of optical radiation detectors to desired operating temperatures, without the need for augmented cooling from any supplementary refrigeration apparatus. The refrigeration apparatus contains several thermoelectric cooling arrays of successively smaller size arranged in a generally pyramidal configuration, with a separate thermally-conductive base plate disposed between each adjacent pair of cooling arrays. The cooling arrays each include Peltier cooling elements arranged in a planar configuration. Polished, thermally-conductive, cup-shaped heat shields are attached to the successive base plates and arranged in a nested relationship, with each heat shield and associated base plate enclosing all of the successively smaller shields and base plates. Each base plate is thermally driven by the preceding thermoelectric cooling array, which also cools the associated heat shield. A window is mounted on an outermost shield which is attached to the hot side of the largest thermoelectric cooling array, thus heating the window to prevent moisture condensation. To minimize parasitic heat flow, electrical leads to an optical radiation detector, mounted within the apparatus and aligned with the window, are attached to the periphery of each of the thermally-conductive base plates, and the interior of the apparatus is preferably evacuated or back filled with a high molecular weight inert gas.

13 Claims, 2 Drawing Sheets

THERMOELECTRIC REFRIGERATION APPARATUS

BACKGROUND OF THE INVENTION

The present invention is directed to refrigeration devices, and, more particularly, to solid state thermoelectric refrigeration devices suitable for cooling optical radiation detectors.

Many electronic devices, such as optical radiation detectors, operate properly at temperatures substantially below ambient room temperature. Some types of very low light level charge-coupled device (CCD) detectors, for example, operate well only at temperatures of about −60° Centigrade. Low light level CCD detectors are commonly used in connection with deep space observational astronomy.

Because of this requirement for sub-zero temperature operation, a number of types of refrigeration devices have been developed for cooling electronic circuits. One type of refrigeration device suitable for this use is based on the thermoelectric or Peltier cooling effect, by which heat is transferred across a junction of two semiconductors of dissimilar conductivity by passing a current through the junction. Thermoelectric refrigeration devices of this type typically include one or more cooling stages, each stage including an array of small individual semiconducting cooling elements, electrically connected in series and arranged so as to form two generally flat surfaces. When an electrical current is passed through the array, one of these surfaces is cooled and the other is heated. The heated surface has a generally greater heat density than does the cooled surface.

Inherent limitations in the heat pumping capacity and efficiency of thermoelectric refrigeration devices have previously limited the use of such devices to applications requiring only a modest amount of heat pumping, at temperatures just slightly below ambient. To achieve colder temperatures, thermoelectric refrigeration devices have typically been used along with some other type of refrigeration device to pre-cool the thermoelectric device and to dissipate waste heat. Thus, thermoelectric cooling devices have previously been employed to refrigerate optical detectors such as low light level CCD detectors, but only when used in connection with an additional refrigeration device, such as an ethylene glycol gas expansion type refrigerator.

Combined refrigeration devices of this sort, however, suffer from a number of shortcomings. The addition of an ethylene-glycol refrigerator, for example, obviates many of the special advantages derived from employing an entirely solid state thermoelectric refrigeration device. Whereas the thermoelectric refrigerator device typically has a long operational life that is virtually free of maintenance, an ethylene glycol refrigerator typically requires repeated maintenance throughout a relatively shorter operational life span. In addition, the need to merge together two different types of refrigeration devices leads to undue complexity.

Accordingly, there still exists a need for a thermoelectric refrigeration apparatus suitable for cooling electronic circuits, such as low light level CCD detectors without augmented cooling from another refrigeration device. The present invention fulfills this need.

SUMMARY OF THE INVENTION

In general terms, the present invention provides a solid state ethermoelectric refrigeration apparatus suitable for cooling a variety of optical radiation detectors without augmentation by a separate refrigeration device. More particularly, the thermoelectric refrigeration apparatus of the present invention includes a series of progressively smaller thermoelectric cooling arrays arranged in a generally pyramidal configuration, with a separate thermally conductive base plate, disposed between and contacting each pair of adjacent cooling arrays, and with a thermally-conductive shield attached to the periphery of each base plate and arranged in a nested relationship, to encase all of the successively smaller thermoelectric arrays, base plates and shields. Each of the shields is also provided with an aperture to provide an optical path to an optical radiation detector mounted on the smallest, and coldest, cooling array.

In another aspect of the present invention, an optical window is mounted on the outermost shield of the refrigeration apparatus, which is attached to the hot side of the base plate adjacent the largest, and hottest, thermoelectric cooling array. This arrangement obviates a need to electrically heat the window to minimize dew formation on the window and on the apparatus' exterior surface.

In yet another aspect of the invention, the thickness of the thermally conducting base plates is selected so that an imaginary line intersecting the outer edges of adjacent thermoelectric cooling arrays generally forms an agle approximately equal to the thermal divergence of the base plate material. In addition, adjacent base plates are bolted together to compress the intervening thermoelectric cooling array, thus enhancing thermal transfer between the array and base plates. The periphery of each base plate is also slotted to allow pasage of electrical leads attached to the optical radiation detector and to reduce the temperature of these leads by the successively lower temperatures of the base plates.

The novel features which are believed to be characteristic of the present invention will be better understood from the following description of the preferred embodiment, considered in connection with the accompanying drawings, wherein like numbers designate like elements. It should be expressly understood, however, that the drawings are for purposes of illustration and description only and are not intended as a definition of the limits of the present invention.

DESCRIPTION OF THE PREFERRED EMBODIMENT

Figure 1:
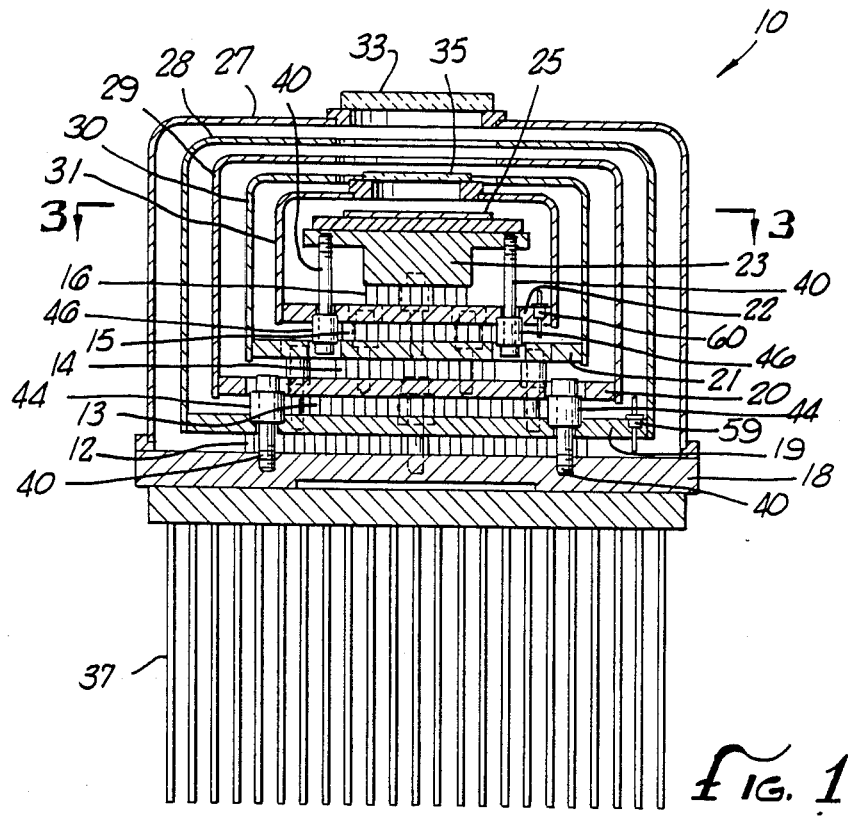
FIG. 1 is a side sectional view of a thermoelectric refrigeration apparatus in accordance with the present invention.
Figure 2:
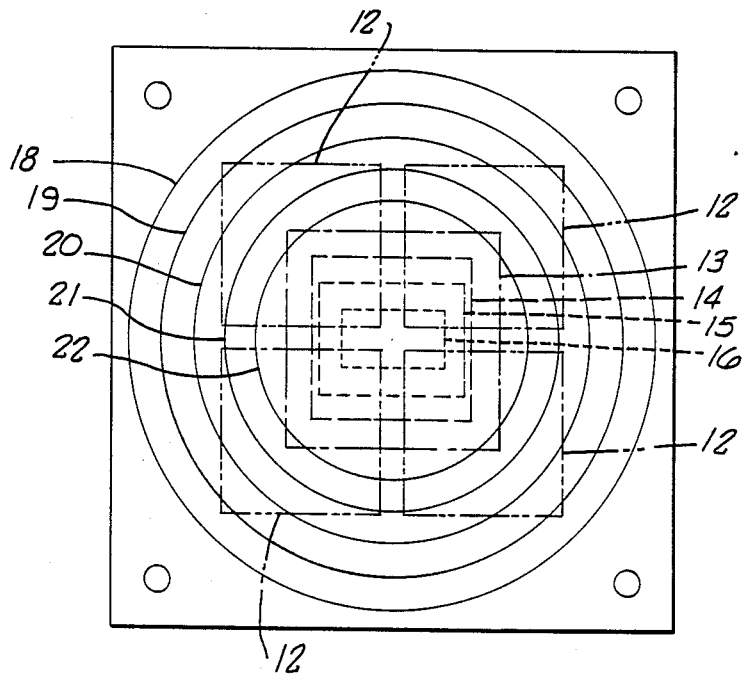
FIG. 2 is a diagrammatic plan view of the thermoelectric refrigeration apparatus of FIG. 1, illustrating the arrangement of the progressively smaller thermoelectric cooling stages.

With reference now to the figures, and particularly to FIG. 1, there is shown a side sectional view of a preferred embodiment of a thermoelectric refrigeration apparatus 10 in accordance with the present invention.

The refrigeration device 10 includes a series of progressively smaller arrays 12, 13, 14, 15 and 16 of thermoelectric cooling elements oriented in a generally pyramidal configuration. The successive arrays are sandwiched between a series of circular, thermally conductive base plates 18, 19, 20, 21, 22 and 23. These base plates, likewise, have progressively smaller sizes and, thus, form a pyramidal shape. In the orientation of FIG. 1, the largest base plate 18 is located at the bottom and the smallest base plate 23 at the top. A radiation detector 25, such as a CCD array, is mounted on the upper surface of the smallest base plate 23.

In use, an electrical current is conducted through each of the cooling element arrays 12–16. This effectively pumps heat from the upper surface to the lower surface of each array. The placement of the arrays in their stacked arrangement, with intervening base plates 18–23, enables the uppermost base plate 23 to be cooled substantially below ambient temperature.

Thin, thermally conductive shields 27, 28, 29, 30 and 31 are individually attached to the peripheries of the respective base plates 18, 19, 20, 21 and 22. The shields are shaped like inverted cups, with the diameter of each corresponding to the diameter of its associated base plate. The successive shields, therefore, nest together, with the largest shield 27 on the outside and the smallest shield 31 on the inside. The shields all include aligned apertures in their upper, circular walls, to define an optical path to the radiation detector 25. To control the environment and for enhanced thermal insulation, windows 33 and 35 cover the apertures of the outermost shield 27 and innermost shield 31, respectively. Additionally, an air cooled radiator 37 is attached to the lower side of the largest (and hottest) base plate 18. This radiates away heat extracted from the interior of the apparatus 10, as well as waste heat generated by the thermoelectric cooling arrays 12–16.

The thermoelectric cooling arrays 12–16 are conventional single stage arrays of Peltier cooling elements and are available from a number of vendors, such as, for example, Melcor Corporation. Because of the nonlinear heat pumping capacity of Peltier cooling elements, the thermoelectric cooling arrays must have increased areas, in the downward direction of heat flow, to accommodate the increasing amount of waste heat being conducted away from the overlying cooling arrays. Thermal energy absorbed by each of the shields 28–31 also must be removed from the apparatus 10 by the successively larger thermoelectric cooling arrays.

To enhance the flow of thermal energy at the interfaces between the interleaved cooling arrays 12–16 and base plates 18–23, layers of conventional thermally-conductive grease are preferably applied to their abutting surfaces. In addition, the thermal conductivity of these interfaces can be significantly enhanced by applying a substantial compressive force. The base plates 18–23 are therefore bolted together to compress the intervening thermoelectric cooling stages 12–16 and thus maximize the pressure at each interface. This arrangement additionally provides an advantageously high immunity to mechanical shock. As illustrated in FIG. 1, a plurality of bolts 40 interconnect each adjacent pair of base plates so as to compress the intervening thermoelectric cooling array.

Preferably, the bolts 40 are made of stainless steel or some other material having high tensile strength and low thermal conductivity. Since the bolts unavoidably bridge the successive thermoelectric cooling arrays 12–16, they provide a thermal path for heat to flow from the heated side to the cooled side of each array. The use of bolts having low thermal conductivity, therefore, minimizes a parasitic heat flow that would otherwise reduce the arrays' net heat pumping capacity. To further minimize this parasitic heat flow, washers 44 made from low thermal conductivity materials such as nylon also are used, to insulate the bolts from the base plates.

While the bolt material is selected to minimize heat flow, the material of the base plates 18–23 is selected so as to maximize heat flow. The base plates are, therefore, preferably made of highly thermally conducting materials such as silver, copper or aluminum.

Figure 4:
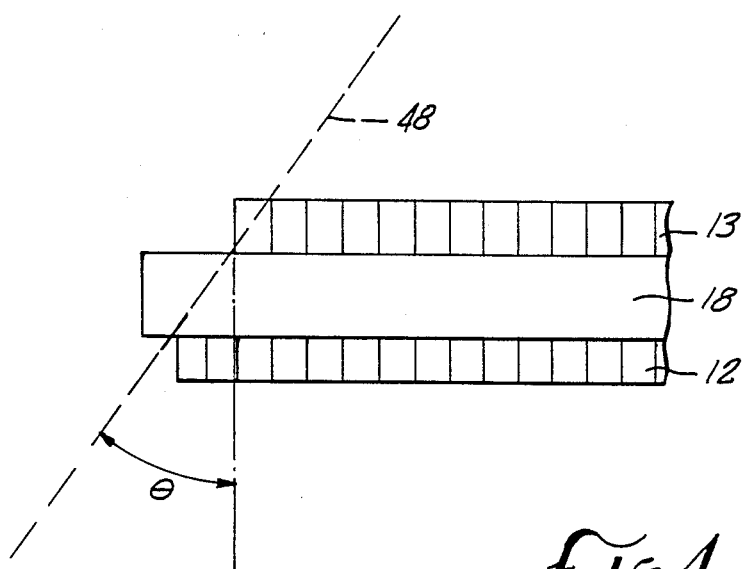
FIG. 4 is a diagramatic side view of a single thermally-conductive base plate disposed between opposing thermoelectric cooling arrays.

Additionally, the thickness of each of the successive base plates is selected to maximize the flow of thermal energy from the heated side of overlaying thermoelectric cooling array to the cooled side of the underlying thermoelectric cooling array. As illustrated in FIG. 4, an angle formed by a line 48 intersecting the outer edges of two exemplary thermoelectric cooling arrays 12 and 13, adjoining the base plate 18, preferably approximates the steady state thermal divergence of the particular material from which the base plate is formed. In the case of a base plate formed of cooper, for example, this angle is preferably about 45°.

Figure 3:
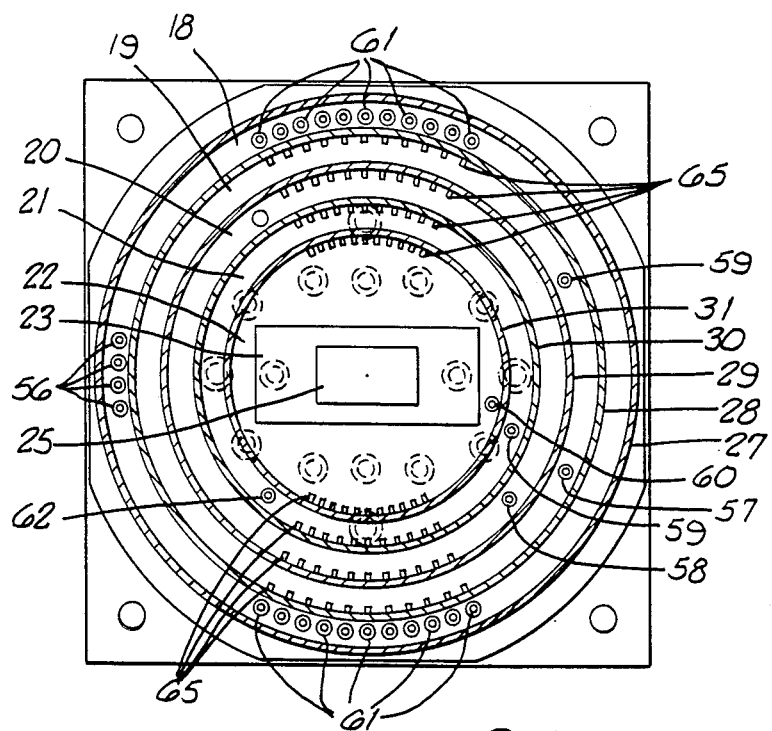
FIG. 3 is a sectional plan view of the thermoelectric refrigeration apparatus, taken in the direction of arrows 3—3 in FIG. 1.

As illustrated in FIGS. 1 and 3, the base plates 18, 19, 20, 21 and 22 are provided with sets of electrical feedthrough terminals 56, 57, 58, 59 and 60, respectively, to provide electrical connections for supplying current to the respective cooling arrays 12, 13, 14, 15 and 16. A second set of feedthrough terminals 61 provides electrical connections for leads (not shown) connected to the radiation detector 25.

The peripheries of the intermediate base plates 19–22 are further provided with slots 65 adapted, to receive the electrical leads (not shown) connected to the radiation detector 25. These leads potentially can provide a significant parasitic heat flow from the exterior of the refrigeration apparatus 10 to the detector 25. Accordingly, the leads are disposed within the slots 65 to successively reduce the lead temperature and thus minimize the heat flow to the detector 25. This arrangement also reduces the thermal load on the smallest, coldest array 16, which has the lowest heat pumping capacity of all the arrays 12–16.

As illustrated in FIG. 1 the heat shields 28, 29, 30 and 31 are attached to the outer edges of the thermally-conducting base plates 19, 20, 21 and 22, respectively. Since the base plates 19, 20, 21 and 22 are connected to the cold sides of the respective cooling arrays 12, 13, 14 and 15, the shields are thermally driven so that a portion of the thermal energy absorbed by each heat shield is removed through the underlying cooling stage. The shields are preferably made of a highly thermally-conductive material such as aluminum, copper or silver and are preferably very highly polished to minimize heat absorption. They can be attached to the edges of the base plates by any convenient means such as, for example, threaded bolts (not shown). A thermally-conductive grease may also be used at each interface between the heat shields and the base plates, to enhance the transfer of thermal energy. The use of heat shields in association with each of the base plates 19–22 provides for maximum cooling by the refrigeration apparatus 10; however, about 90 percent of that maximum cooling capacity can be achieved using only the two heat shields 28 and 31 and eliminating the intervening heat shields 29 and 30.

The outermost heat shield 27 functions as an outer diameter shell for the refrigeration apparatus 10. It is attached to, and is in thermal contact with, the base plate 18, which is, in turn, in thermal contact with the heated side of the first cooling array. Since all of the thermal energy being extracted from the interior of the refrigeration apparatus 10, along with waste heat from the successive thermoelectric cooling arrays 12–16, flows through the base plate 18 to be dissipated by the air-cooled radiator 37, the outermost shield 27 will be at a higher temperature than the ambient air. This heats the window 33, mounted over the aperture in the outermost shield, and prevents moisture from condensing on the window, thus obviating the need for a low humidity environment.

To maximize the cooling capacity of the refrigeration apparatus 10, and to prevent internal moisture condensation, the interior of the apparatus may further be back filled with a dry, inert gas. The insulating capacity of this inert gas improves with molecular weight. Thus, back filling the apparatus with xenon or argon gas provides greater insulation and a higher net cooling capacity for the apparatus than lighter gases such as nitrogen or helium. The shields 28–31 advantageously disrupt the formation of convection currents in this back fill gas.

It should be appreciated from the foregoing that the present invention provides a reliable refrigeration apparatus suitable for cooling various radiation detectors to temperatures of less than about −70° centigrade. The apparatus needs little or no maintenance during its operational life and does not operation. It will, of course, be understood that modifications to the presently preferred embodiment will be apparent to those skilled in the art. Consequently, the scope of the present invention should not be limited by the particular embodiment discussed above, but should be defined only by the claims set forth below and equivalents thereof.

What is claimed is:

1. A solid state refrigeration apparatus for cooling an optical radiation detector, comprising:
   a plurality of generally flat thermoelectric cooling arrays of progressively smaller areas, the optical radiation detector being located adjacent the smallest array;
   a plurality of generally flat thermally-conducting plates interleaved with, and in thermal contact with, the plurality of thermoelectric cooling arrays, wherein the plates have progressively smaller areas like the corresponding cooling arrays such that the plates and the arrays together form a generally pyramidal shape; and
   a plurlity of generally cup-shaped heat shields of progressively smaller size, each shield attached to, and in thermal contact with, a separate thermally-conducting plate, wherein the heat shields are arranged in a nested relationship, with each shield and associated plate enclosing any smaller heat shields and plates;
   wherein aligned apertures are formed in the plurality of heat shields, to provide an optical path from the exterior of the apparatus to the optical radiation detector located adjacent the smallest thermoelectric cooling array, within an innermost shield of the plurality of heat shields.

2. The solid state refrigeration apparatus of claim 1, wherein each of the thermally-conducting plates has a thickness selected to space apart the thermoelectric cooling arrays located on its opposite sides by an amount such that the peripheral edges of cooling arrays form an angle generally corresponding with the thermal divergence of the plate material.

3. The solid state refrigeration apparatus of claim 1, and further including electrical leads connecting the optical radiation detector to the exterior of the refrigeration apparatus, wherein the leads thermally contact at least some of the thermally-conducting plates.

4. The solid state refrigeration apparatus of claim 1, and further comprising means for compressing together the bolts successive interleaved thermally-conducting plates and thermoelectric cooling stages.

5. The solid state refrigeration apparatus of claim 4, wherein the compressing means comprises:
   a plurality of bolts interconnecting each adjacent pair of thermally-conducting pltes; and
   a plurality of thermally insulating washers separating the plurality of bolts from at least one of each associated pair of thermally-conducting plates.

6. The solid state refrigeration apparatus of claim 1, wherein:
   the apparatus further includes a transparent window overlying the aperture of the largest, outermost heat shield of the plurality of heat shields; and
   the largest, outermost shield is thermally attached to a thermally-conducting plate that is at a temperature above that of the ambient environment, whereby the possibility of moisture condensation on the window is minimized.

7. A solid state refrigeration apparatus for cooling an optical radiation detector, comprising:
   a plurality of generally flat thermoelectric cooling arrays of progressively smaller areas, the optical radiation detector being located adjacent the smaller array;
   a plurality of generally flat thermally conducting plates interleaved with, and in thermal contact with, the plurality of thermoelectric cooling arrays, wherein the plates have progressively smaller areas like the corresponding cooling arrays such that the plates and the arrays together form a generally pyramidal shape;
   a generally cup-shaped outer shell enclosing the plurality of thermoelectric cooling arrays and thermally-conducting plates and forming an aperture to provide an optical path from the exterior of the apparatus to the optical radiation detector, said shield being thermally attached to a thermally-conducting plate that is at a temperature above that of the an ambient environment; and
   an optical window overlying the aperture of the shell, wherein the possibility of moisture condensation on the window is minimized.

8. The solid state refrigeration apparatus of claim 7, wherein each of the thermally-conducting plates has a thickness selected to space apart adjacent thermoelectric cooling arrays, located on its opposite sides, by an amount such that the peripheral edges of cooling arrays form an angle generally corresponding with the thermal divergence of the plate material.

9. The solid state refrigeration apparatus of claim 7, and further including electrical leads connecting the optical radiation detector to the exterior of the refrigeration apparatus, wherein the leads themally contact at least some of the thermally-conducting plates.

10. The solid state refrigeration apparatus of claim 7, and further comprising means for compressing together the successive interleaved thermally-conducting plates and thermoelectric cooling stages.

11. The solid state refrigeration apparatus of claim 10, wherein the compressing means comprises:
   a plurality of bolts interconnecting each adjacent pair of thermally-conducting plates; and
   a plurality of thermally insulating washers separating the plurality of bolts from at least one of each associated pair of thermally-conducting plates.

12. The solid state refrigeration apparatus of claim 1, and further comprising a plurality of generally cup-shaped heat shields of progressively smaller size, each heat shield attached to, and in thermal contact with, a separate thermally-conducting plate, wherein the heat shields are arranged in a nested relationship, with each heat shield and associated plate enclosing any smaller heat shields and plates, and wherein aligned apertures are formed in the plurality of heat shields to provide an optical path from the exterior of the apparatus to the optical radiation detector, located adjacent the smaller thermoelectric cooling array, within an innermost shield of the plurality of heat shields.

13. A solid state refrigeration apparatus for cooling an optical radiation detector, comprising:
   a plurality of generally flat thermoelectric cooling arrays of progressively smaller areas, the optical radiation detector being located adjacent the smallest array;
   a plurality of generally flat thermally-conducting plates interleaved with, and in thermal contact with, the plurality of thermoelectric cooling arrays and having thicknesses selected to space apart adjacent thermoelectric cooling arrays located on opposite sides of a plate by an amount such that peripheral edges of the adjacent cooling arrays form an angle generally corresponding with the thermal divergence of the plate material, the plates further having progressively smaller areas like the corresponding cooling arrays such that the plates and the arrays together form a generally pyramidal shape;
   means for compressing together successive and interleaved thermally-conducting plates and thermoelectric cooling stages;
   a plurality of electrical leads connecting the optical radiation detector to an exterior of the refrigeration apparatus, wherein the leads thermally contact at least some of the thermally-conducting plates;
   a plurality of generally cup-shaped and aperatured heat shields of progressively smaller size, each shield attached to, and in thermal contact with, a separate thermally-conducting plate, the shields being arranged in a nested relationship, with each shield and associated thermally-conducting plate enclosing any smaller heat shields and plates, and with the largest outermost heat shield being thermally attached to a thermally-conducting plate that is at a temprature above an ambient environment, the shields further being aligned so that apertures formed in the heat shields provide an optical path from the exterior of the apparatus to the optical radiation detector within an innermost shield of the plurality of heat shields; and
   an optical window overlying the aperture of the largest outermost heat shield, wherein the possibility of moisture condensation on the window is minimized.

* * * * *

UNITED STATES PATENT AND TRADEMARK OFFICE
CERTIFICATE OF CORRECTION

PATENT NO. : 4,833,889
DATED : May 30, 1989
INVENTOR(S) : Robert W. Harwell and William M. Simon It is certified that error appears in the above-identified patent and that said Letters Patent is hereby corrected as shown below:

In column 1, line 68, change "ethermoelectric" to --thermoelectric--.

In column 5, line 4, change "diameter" to --container--.

In column 6, line 18, change "pltes" to --plates--.

Signed and Sealed this

Twelfth Day of June, 1990

Attest:

HARRY F. MANBECK, JR.

*Attesting Officer*                *Commissioner of Patents and Trademarks*